US010541208B2

(12) United States Patent
Oomori

(10) Patent No.: US 10,541,208 B2
(45) Date of Patent: Jan. 21, 2020

(54) SEMICONDUCTOR MODULE FOR A POWER CONVERSION CIRCUIT FOR RELIABLY REDUCING A VOLTAGE SURGE

(71) Applicant: SUMITOMO ELECTRIC INDUSTRIES, LTD., Osaka (JP)

(72) Inventor: Hirotaka Oomori, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/078,218

(22) PCT Filed: Jan. 31, 2017

(86) PCT No.: PCT/JP2017/003388
§ 371 (c)(1),
(2) Date: Aug. 21, 2018

(87) PCT Pub. No.: WO2017/159081
PCT Pub. Date: Sep. 21, 2017

(65) Prior Publication Data
US 2019/0051606 A1   Feb. 14, 2019

(30) Foreign Application Priority Data

Mar. 15, 2016 (JP) ................................. 2016-051416

(51) Int. Cl.
*H01L 23/538* (2006.01)
*H01L 25/18* (2006.01)
(Continued)

(52) U.S. Cl.
CPC ...... *H01L 23/5386* (2013.01); *H01L 21/4846* (2013.01); *H01L 23/62* (2013.01);
(Continued)

(58) Field of Classification Search
CPC . H01L 21/4846; H01L 23/5386; H01L 23/62; H01L 25/07; H01L 25/072; H01L 25/16; H01L 25/18
See application file for complete search history.

(56) References Cited

U.S. PATENT DOCUMENTS

2012/0099357 A1* 4/2012 Morita ................ H01L 27/0617
363/131
2013/0058068 A1* 3/2013 Funatsu ............. H05K 7/20927
361/820

FOREIGN PATENT DOCUMENTS

JP         2015-135895         7/2015

* cited by examiner

*Primary Examiner* — Andrew Q Tran
(74) *Attorney, Agent, or Firm* — IPUSA, PLLC

(57) ABSTRACT

A semiconductor module according to one embodiment includes a circuit substrate and first and second transistors for upper and lower arms of a power conversion circuit. The circuit substrate includes a substrate having first and second insulating parts and a conductive layer disposed therebetween, first and second input interconnection patterns coupled to the first and second input terminals, and an output interconnection pattern coupled to an output terminal. The first and second transistors are electrically coupled to the first and second input terminals through the first and second input interconnection patterns, respectively. The conductive layer has a first area situated opposite the first input interconnection pattern and a second area electrically coupled to the first area. The second area is electrically coupled to the second input interconnection pattern. The conductive layer is insulated from the first input interconnection pattern and the output interconnection pattern by the second insulating part.

16 Claims, 8 Drawing Sheets

(51) Int. Cl.
    *H02M 1/32*      (2007.01)
    *H01L 21/48*     (2006.01)
    *H01L 23/62*     (2006.01)
    *H01L 25/07*     (2006.01)
    *H01L 25/16*     (2006.01)
    *H02M 7/00*      (2006.01)
    *H02M 7/537*     (2006.01)
    *H01L 23/36*     (2006.01)
    *H01L 23/498*    (2006.01)
    *H01L 23/367*    (2006.01)
    *H01L 23/00*     (2006.01)

(52) U.S. Cl.
    CPC ............ *H01L 25/072* (2013.01); *H01L 25/16* (2013.01); *H01L 25/18* (2013.01); *H02M 1/32* (2013.01); *H02M 7/003* (2013.01); *H02M 7/537* (2013.01); *H01L 23/36* (2013.01); *H01L 23/3675* (2013.01); *H01L 23/49811* (2013.01); *H01L 23/5383* (2013.01); *H01L 24/45* (2013.01); *H01L 24/48* (2013.01); *H01L 2224/45124* (2013.01); *H01L 2224/45147* (2013.01); *H01L 2224/48091* (2013.01); *H01L 2224/48227* (2013.01); *H01L 2224/4917* (2013.01); *H01L 2924/1203* (2013.01); *H01L 2924/1205* (2013.01); *H01L 2924/13055* (2013.01); *H01L 2924/13091* (2013.01); *H02M 2001/325* (2013.01)

SEMICONDUCTOR MODULE FOR A POWER CONVERSION CIRCUIT FOR RELIABLY REDUCING A VOLTAGE SURGE

TECHNICAL FIELD

The disclosures herein relate to a semiconductor module.

The present application claims priority based on Japanese application No. 2016-051416 filed on Mar. 15, 2016, the entire contents of which are hereby incorporated by reference.

BACKGROUND ART

In order to suppress a surge voltage generated between the positive-side input terminal and the negative-side input terminal of a power conversion circuit incorporated in a semiconductor module, Patent Document 1 provides a snubber capacitor, serving as a surge voltage absorbing element, connected between the positive-side input terminal and the negative-side input terminal.

[Patent Document 1] Japanese Patent Application Publication No. 2015-135895

SUMMARY OF THE INVENTION

A semiconductor module according to an aspect of the present disclosures is a semiconductor module including a power conversion circuit, and includes a circuit substrate, a first transistor mounted on the circuit substrate and constituting an upper arm of the power conversion circuit, and a second transistor, mounted on the circuit substrate, constituting a lower arm of the power conversion circuit and electrically series-coupled to the first transistor. The circuit substrate includes a substrate having a first insulating part, a second insulating part disposed over the first insulating part, and a conductive layer situated between the first insulating part and the second insulating part, a first input interconnection pattern disposed on the second insulating part and electrically coupled to a first input terminal through which first power is supplied to the power conversion circuit, the first input interconnection pattern having the first transistor mounted thereon, a second input interconnection pattern disposed on the second insulating part and electrically coupled to a second input terminal through which second power lower than the first power is supplied to the power conversion circuit, and an output interconnection pattern disposed on the second insulating part and coupled to an output terminal through which output power of the power conversion circuit is output, the output interconnection pattern having the second transistor mounted thereon. The first transistor is electrically coupled to the first input interconnection pattern such as to receive the first power through the first input interconnection pattern. The second transistor is electrically coupled to the second input interconnection pattern such as to receive the second power through the second input interconnection pattern. The conductive layer includes a first area and a second area electrically coupled to the first area. The first area is situated opposite the first input interconnection pattern. The second area is electrically coupled to the second input interconnection pattern. The conductive layer is insulated from the first input interconnection pattern and the output interconnection pattern by the second insulating part.

MODE FOR CARRYING OUT THE INVENTION

Figure 1:
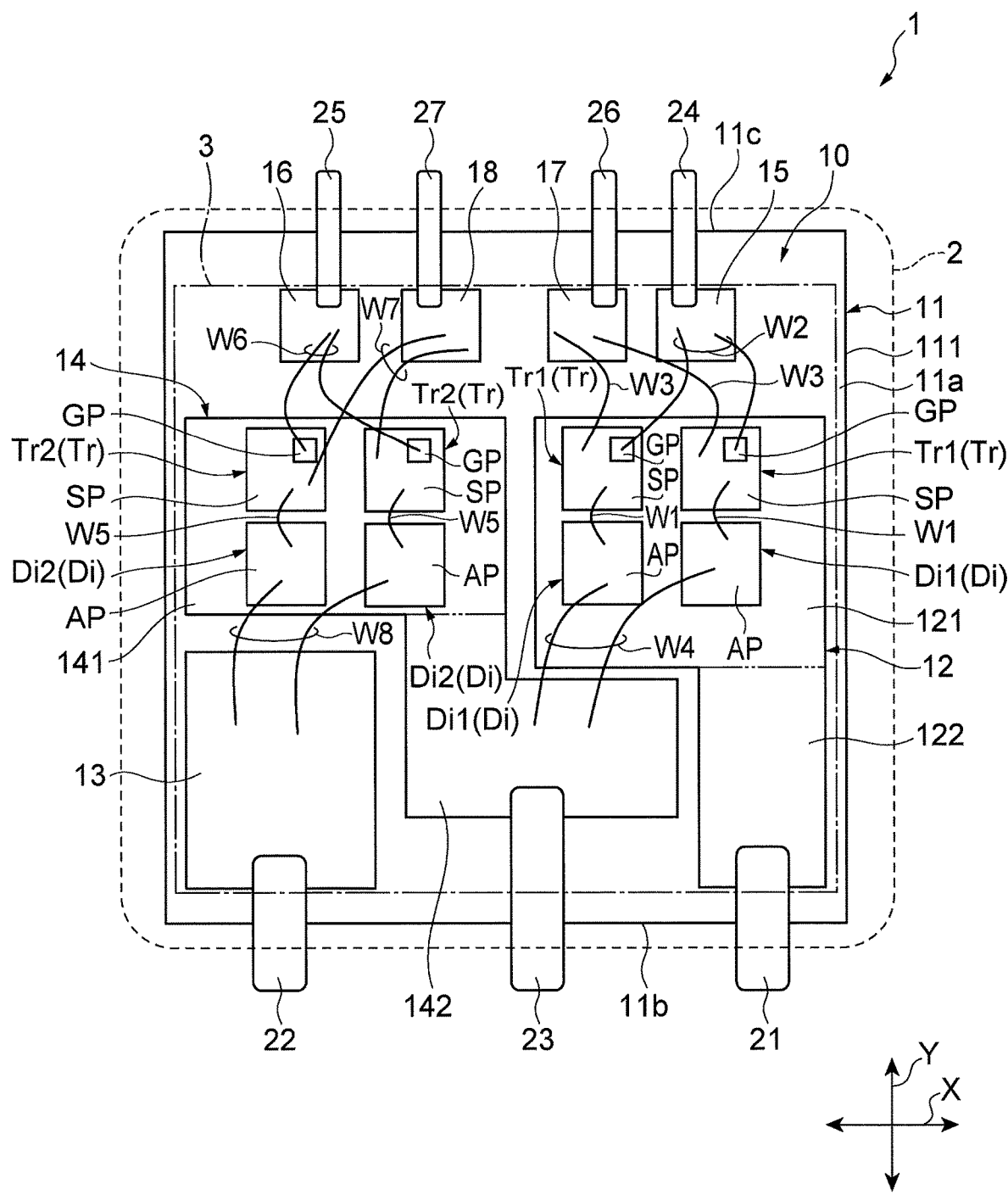
FIG. 1 is a plan view illustrating a schematic configuration of a semiconductor module according to an embodiment.

In the technology disclosed in Patent Document 1, the part on which the transistors are mounted and the part on which the snubber capacitor is mounted are separately formed on the substrate on which the switching-element transistors or the like are mounted, thereby thermally separating these parts from each other, in order to prevent degradation caused by heat from the snubber capacitor (i.e., surge voltage absorbing device). In such a case, the distance between the transistors and the snubber capacitor tends to be elongated, which may result in the failure to sufficiently reduce surge voltage.

Accordingly, one of the objects is to provide a semiconductor module that is capable of reducing surge voltage more reliably.

In the following, embodiments of the technology of the present disclosures will be described with reference to the accompanying drawings. In the description of the drawings, the same elements are referred to by the same numerals, and a duplicate description will be omitted.

Description of Embodiments

In the following, embodiments of the disclosed technology will be listed and described.

A semiconductor module according to an aspect of the disclosed technology is a semiconductor module including a power conversion circuit, and includes a circuit substrate, a first transistor mounted on the circuit substrate and constituting an upper arm of the power conversion circuit, and a second transistor, mounted on the circuit substrate, constituting a lower arm of the power conversion circuit and electrically series-coupled to the first transistor. The circuit substrate includes a substrate having a first insulating part, a second insulating part disposed over the first insulating part, and a conductive layer situated between the first insulating part and the second insulating part, a first input interconnection pattern disposed on the second insulating part and coupled to a first input terminal through which first power is supplied to the power conversion circuit, the first input interconnection pattern having the first transistor mounted thereon, a second input interconnection pattern disposed on the second insulating part and coupled to a second input terminal through which second power lower than the first power is supplied to the power conversion circuit, and an output interconnection pattern disposed on the second insulating part and coupled to an output terminal through which output power of the power conversion circuit is output, the output interconnection pattern having the second transistor mounted thereon. The first transistor is electrically coupled to the first input interconnection pattern such as to receive the first power through the first input interconnection pattern. The second transistor is electrically coupled to the second input interconnection pattern such as to receive the second power through the second input interconnection pattern. The conductive layer includes a first area and a second area electrically coupled to the first area. The first area is situated opposite the first input interconnection pattern. The second area is electrically coupled to the second input interconnection pattern. The conductive layer is insulated from the first input interconnection pattern and the output interconnection pattern by the second insulating part.

In the above-noted configuration, the first transistor and the second transistor are electrically connected in series between the first input interconnection pattern and the second input interconnection pattern which are electrically coupled to the first input terminal and the second input terminal, respectively, thereby constituting the power conversion circuit. Accordingly, the power applied between the first input terminal and the second input terminal can be converted by the power conversion circuit for output through the output interconnection pattern and the output terminal.

The substrate of the circuit substrate includes the conductive layer situated between the first insulating part and the second insulating part. The second area of the conductive layer is electrically coupled to the second input interconnection pattern electrically coupled to the second input terminal, while insulated from the first input interconnection pattern and the output interconnection pattern by the second insulating part. Accordingly, the potential of the conductive layer is substantially the same as the potential of the second input interconnection pattern. Due to the fact that the first area is situated opposite the first input interconnection pattern electrically coupled to the first input terminal, the first area of the conductive layer, the first input interconnection pattern, and the second insulating part constitute a capacitor. This capacitor is connected in parallel to the first transistor and the second transistor which are connected in series between the first input interconnection pattern and the second input interconnection pattern, thereby serving as a surge voltage absorbing capacitor. The first input interconnection pattern has the first transistor mounted thereon, so that the surge voltage absorbing capacitor is situated in proximity to the first transistor. Accordingly, surge voltage can be reliably reduced.

Part of the output interconnection pattern may be situated between the first input interconnection pattern and the second input interconnection pattern.

The conductive layer may not overlap the output interconnection pattern when viewed in the thickness direction of the substrate. The potential of the output interconnection pattern is responsive to the output potential, and, thus, constantly changes. If there was an overlapping area between the output interconnection pattern and the conductive layer as viewed in the thickness direction of the substrate, a parasitic capacitance would be created between the output interconnection pattern and the conductive layer. As a result, displacement current responsive to the created parasitic capacitance would flow from the output interconnection pattern to the second input interconnection pattern through the conductive layer, thereby creating a potential distribution in the second input interconnection pattern. The configuration in which the conductive layer does not overlap the output interconnection pattern when viewed in the thickness direction of the substrate as was described above can reduce such a potential distribution. As a result, the second power applied to the second transistor through the second input interconnection pattern can be stabilized.

The circuit substrate may include an auxiliary interconnection pattern disposed in proximity to the first input interconnection pattern on the second insulating part. The conductive layer may be electrically coupled to the auxiliary interconnection pattern. The auxiliary interconnection pattern and the first input interconnection pattern may be coupled through a surge voltage absorbing element.

The above-noted auxiliary interconnection pattern is electrically coupled to the conductive layer, and, thus, has the same potential as the second input interconnection pattern. In the above-noted configuration, thus, the first input interconnection pattern electrically coupled to the first input terminal and the second input interconnection pattern electrically coupled to the second input terminal are coupled through the surge voltage absorbing element. This surge voltage absorbing element also serves to absorb surge voltage, which can achieve further reduction in the surge voltage.

In one embodiment, the semiconductor module may include the plurality of noted first transistors. The plurality of first transistors may be mounted on the first input interconnection pattern, and may electrically be coupled in parallel. Moreover, the semiconductor module may include the plurality of noted second transistors. The plurality of second transistors may be mounted on the output interconnection pattern, and may electrically be coupled in parallel. In such a configuration, the semiconductor module can produce a large electric current.

Details of Embodiments

In the following, specific examples of the embodiments of the disclosed technology will be described with reference to the drawings. The disclosed technology is not limited to those examples, and is intended to be defined by the scope of the claims and to include any variations and modifications falling within the scope warranted for equivalents of the scope of the claims. In the description of the drawings, the same elements are referred to by the same numerals, and a duplicate description will be omitted.

A semiconductor module 1 schematically illustrated in FIG. 1 serves as a power conversion apparatus such as an inverter device. The semiconductor module 1 includes a plurality of transistors Tr and a circuit substrate 10. The semiconductor module 1 may include a plurality of diodes Di, and may include a case 2 which accommodates the circuit substrate 10 having the transistors Tr mounted thereon. In FIG. 1, the case 2 is schematically illustrated in dashed lines. The case 2 is made of a resin, for example. Inside the case 2, the transistors Tr are encapsulated in silicone gel, for example.

In the following, a description will be given of a configuration in which the semiconductor module 1 includes the diodes Di and the case 2 unless stated otherwise. In the descriptions, two directions perpendicular to the thickness direction of the circuit substrate 10 may sometimes be referred to as the X direction and the Y direction, as illustrated in FIG. 1. The X direction and the Y direction are perpendicular to each other.

The plurality of transistors Tr are mounted on the circuit substrate 10. The transistors Tr, which are vertical transistors, include a first upper electrode SP, a second upper electrode GP, and a lower electrode DP (see FIG. 5 and FIG. 6). The first upper electrode SP and the lower electrode DP are the first main electrode and the second main electrode, respectively, for supplying power (e.g., voltage) to the transistors Tr. The second upper electrode GP is the control electrode for supplying a control signal (or a control voltage) to the transistors Tr. The conductive state of each transistor Tr between the first upper electrode SP and the lower electrode DP is controlled in response to the control signal applied to the second upper electrode GP. With this arrangement, the transistors Tr serve as switching elements. The transistors Tr may alternatively be lateral transistors.

Examples of the material of the transistors Tr include Si and wide-bandgap semiconductors such as SiC and GaN. Examples of the transistors Tr include a MOSFET (i.e., metal-oxide-semiconductor field-effect transistor) and an insulated-gate bipolar transistor (i.e., IGBT).

In the case of the transistors Tr being MOSFETs, the first upper electrode SP, the second upper electrode GP, and the lower electrode DP correspond to the source electrode, the gate electrode, and the drain electrode, respectively. In the case of the transistors Tr being IGBTs, the first upper electrode SP, the second upper electrode GP, and the lower electrode DP correspond to the emitter electrode, the gate electrode, and the collector electrode, respectively. In the following, the transistors Tr are MOSFETs, unless otherwise indicated.

The plurality of transistors Tr are electrically coupled to form a power conversion circuit 3. In the present embodiment, the power conversion circuit 3 is a single-phase inverter circuit. In this case, the semiconductor module 1 is a 2-in-1-type semiconductor module, for example. Among the plurality of transistors Tr, the transistors Tr constituting the upper arm of the power conversion circuit 3 are referred to as first transistors Tr1, and the transistors Tr constituting the lower arm are referred to as second transistors Tr2. An example illustrated in FIG. 1 is directed to a configuration in which the semiconductor module 1 has two first transistors Tr1 and two second transistors Tr2. However, the number of first transistors Tr1 and the number of second transistors Tr2 are not limited to two.

The plurality of diodes Di, which are mounted on the circuit substrate 10, serve as freewheeling diodes in the power conversion circuit 3. The plurality of diodes Di include first diodes Di1 corresponding to the first transistors Tr1 and second diodes Di2 corresponding to the second transistors Tr2. The number of first diodes Di1 may be equal to the number of first transistors Tr1, for example, or may be different. Similarly, the number of second diodes Di2 may be equal to the number of second transistors Tr2, or may be different.

Figure 2:
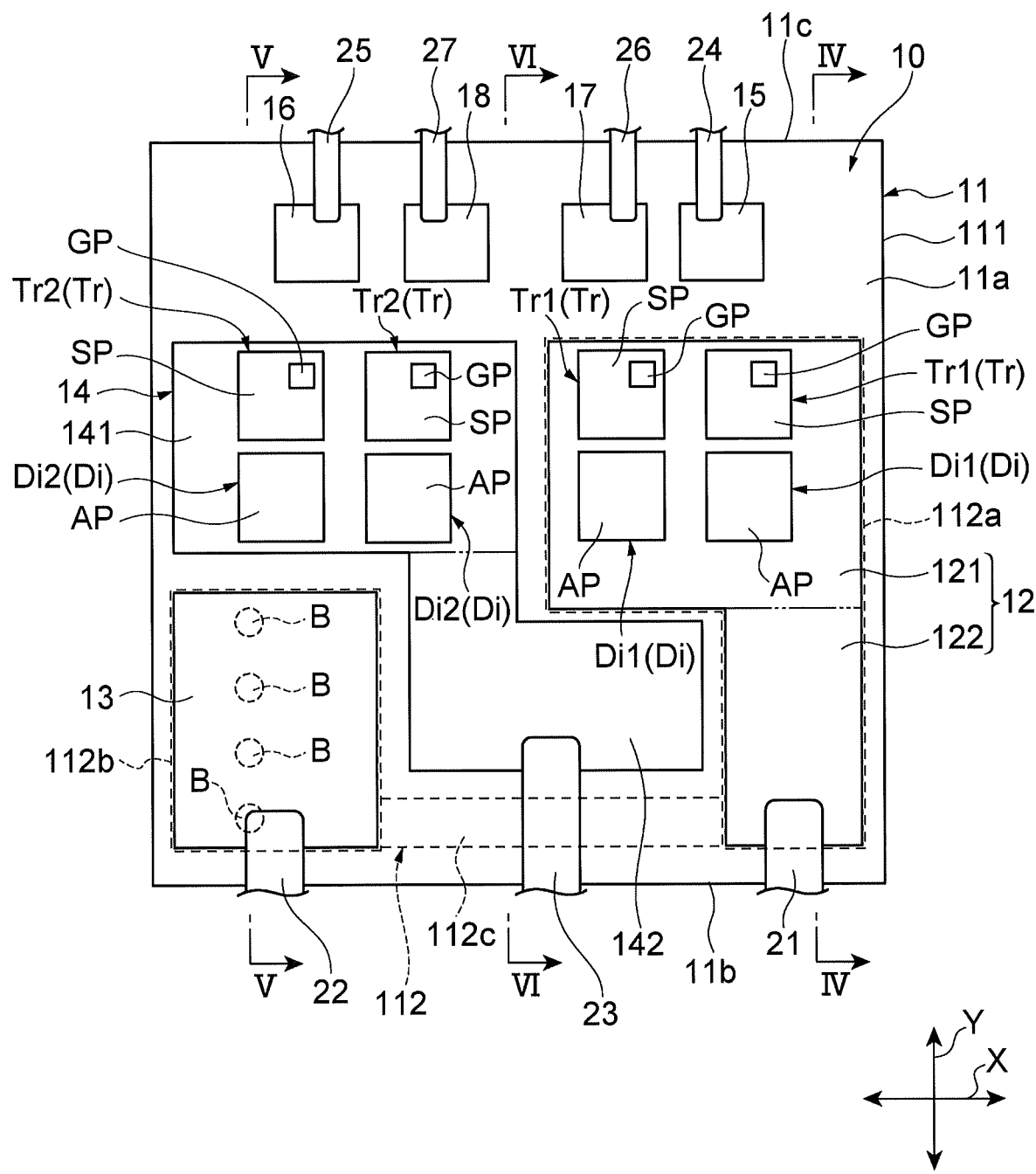
FIG. 2 is a schematic diagram for the purpose of illustrating the configuration of a circuit substrate of the semiconductor module illustrated in FIG. 1.

In the following, the circuit substrate 10 will be described. As is schematically illustrated in FIG. 2, the circuit substrate 10 includes a substrate 11, a P pad (first input interconnection pattern) 12, an N pad (second input interconnection pattern) 13, and an O pad (output interconnection pattern) 14. FIG. 2 is a schematic diagram for the purpose of illustrating the configuration of the circuit substrate 10, in which wires W1 through W8 are omitted for the sake of clear illustration. The circuit substrate 10 may include a first control pad and a second control pad 16, and may include a first auxiliary pad 17 and a second auxiliary pad 18. In the following, a description will be given of a configuration in which the circuit substrate 10 includes the first control pad 15, the second control pad 16, the first auxiliary pad 17, and the second auxiliary pad 18.

As illustrated in FIG. 2 through FIG. 6, the substrate 11 includes a main part 111 having an insulating property and a conductive layer 112 disposed in the inside thereof. The back face of the substrate 11 may have a heat dissipation layer RL formed thereon. The material of the heat dissipation layer RL may be the same as the material of the pads such as the P pad 12 and the N pad 13, for example. The back face of the substrate 11 of the present embodiment has the heat dissipation layer RL formed thereon unless otherwise stated.

Figure 3:
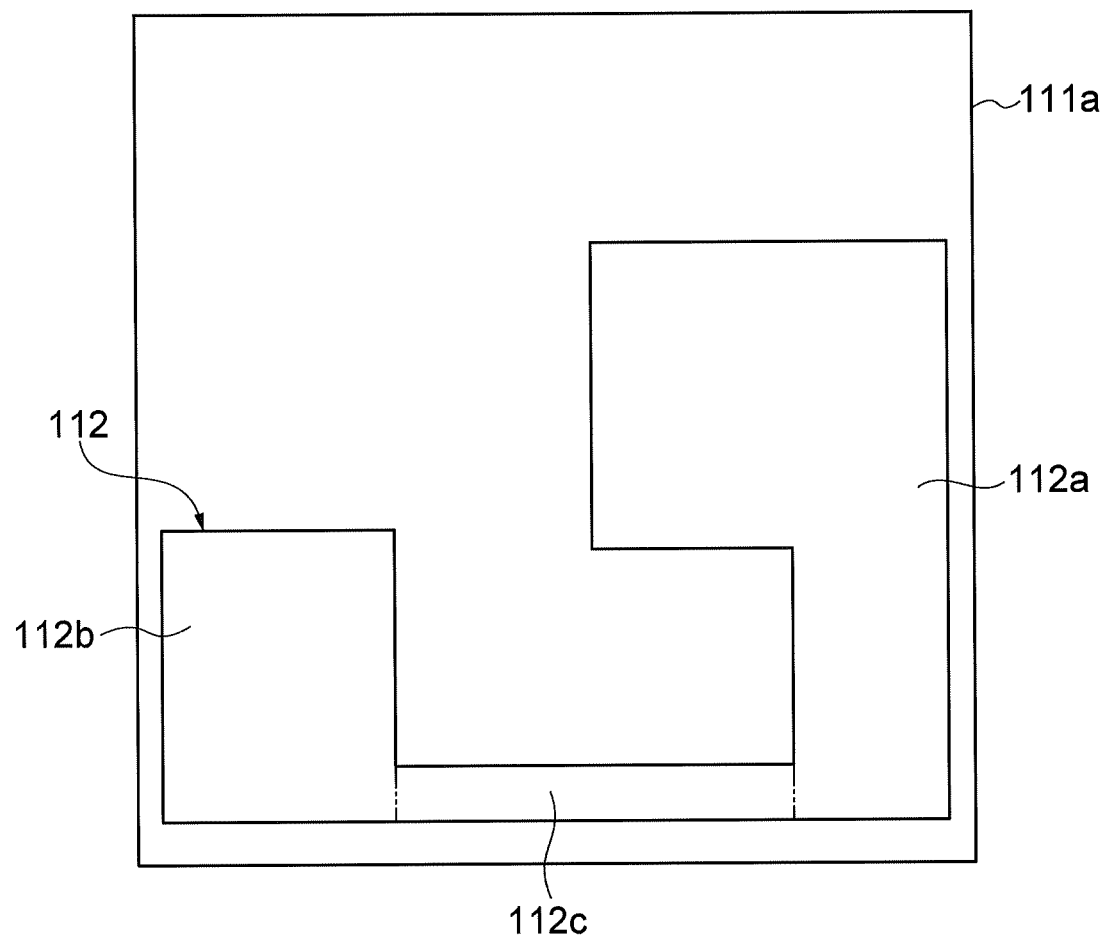
FIG. 3 is a schematic diagram for the purpose of illustrating a conductive layer.
Figure 3:
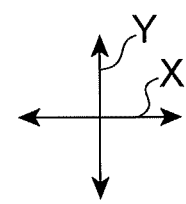
Figure 4:
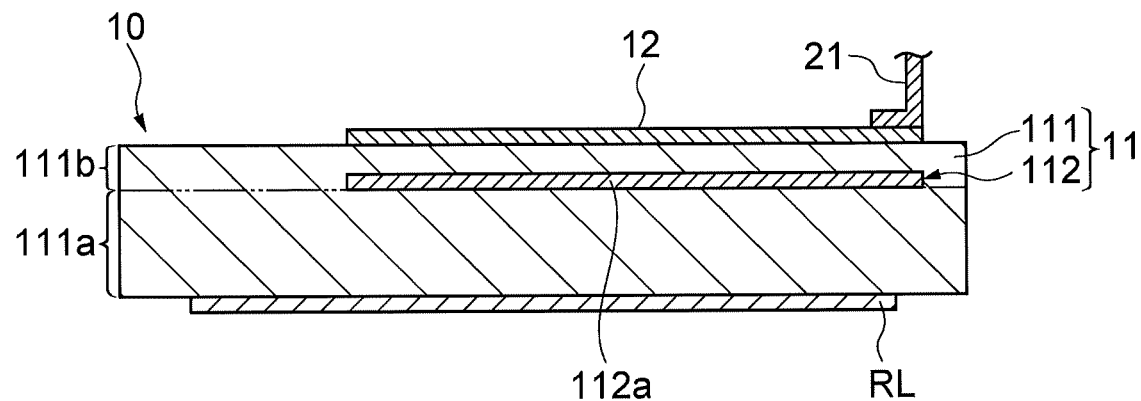
FIG. 4 is a schematic diagram of a cross-sectional configuration along the line IV-IV in FIG. 2.
Figure 5:
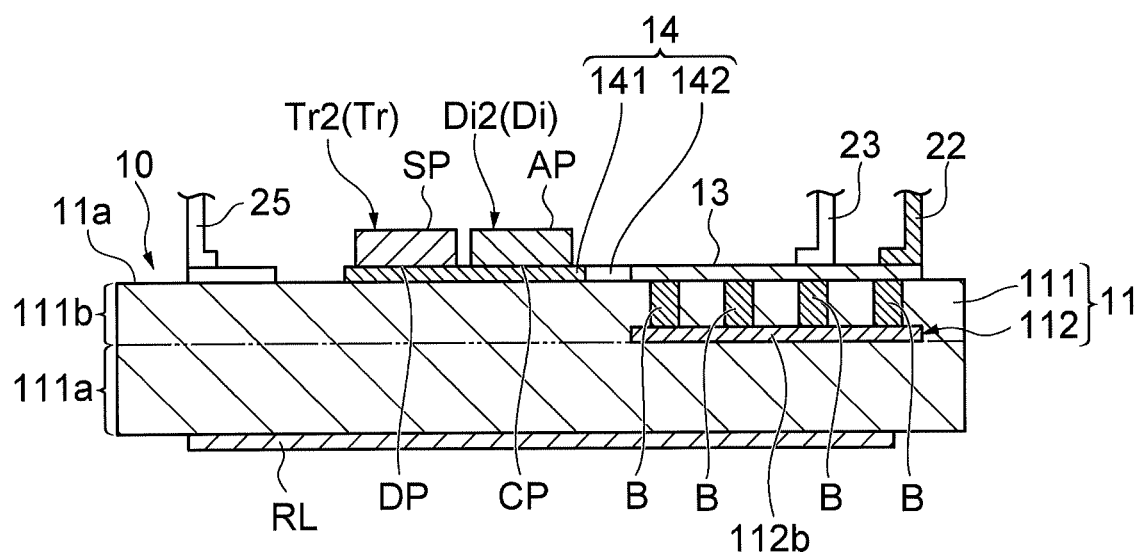
FIG. 5 is a schematic diagram of a cross-sectional configuration along the line V-V in FIG. 2.
Figure 6:
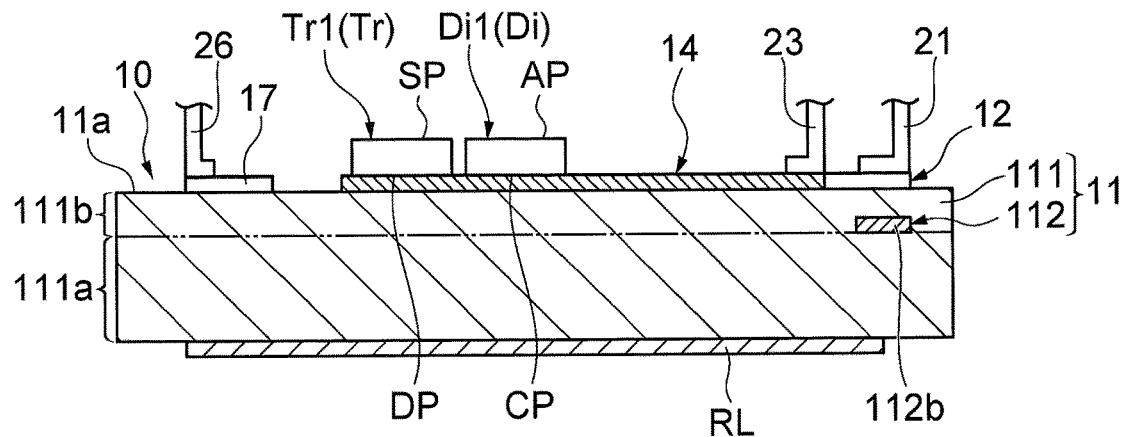
FIG. 6 is a schematic diagram of a cross-sectional configuration along the line VI-VI in FIG. 2.

The main part 111 has a plate shape The material of the main part 111 may be ceramics such as AlN, SiN, $Al_2O_3$, for example. The conductive layer 112 is placed between, and parallel to, the front face and the back face of the main part 111 in the thickness direction of the main part 111. For the sake of convenience of explanation, the portion of the main part 111 situated toward the back face relative to the conductive layer 112 may be referred to as a first insulating layer (first insulating part) 111a, and the portion situated toward the front face relative to the conductive layer 112 may be referred to as a second insulating layer (second insulating part) 111b. In such a case, the substrate 11 is a multilayered structure in which the conductive layer 112 and the second insulating layer 111b are stacked in this order on the first insulating layer 111a. FIG. 3 is a drawing illustrating the substrate 11 in the state in which the second insulating layer 111b is removed for the purpose of illustrating the conductive layer 112. In FIG. 4 through FIG. 6, the boundary between the first insulating layer 111a and the second insulating layer 111b is shown by a dash and two-dot line for the sake of identifying the first insulating layer 111a and the second insulating layer 111b.

As is illustrated in FIG. 2, the P pad 12, which is disposed on a surface 11a of the substrate 11 (namely, on the second insulating layer 111b), is an electrode pattern (or interconnection pattern) for supplying positive power (first power) such as positive voltage to the power conversion circuit 3. An example of the material of the P pad 12 is copper. The P pad 12 includes a first area 121 and a second area 122. In FIG. 2, the boundary between the first area 121 and the second area 122 is shown by a dash-and-two-dot line for illustrative purposes. This also applies to other drawings (e.g., FIG. 1).

The first area 121 is the transistor mounting area on which the plurality of first transistors Tr1 are mounted. The first area 121 also has the first diodes Di1 mounted thereon each corresponding to a respective first transistor Tr1. It suffices for the first area 121 to have an area of sufficient size for mounting the plurality of first transistors Tr1 and the plurality of first diodes Di1. The first area 121 is not limited to a particular shape, and may be a quadrilateral such as a rectangle or a square.

Each first transistor Tr1 is mounted on the first area 121 such that the lower electrode DP and the first area 121 face each other, and are electrically coupled to each other. Each first diode Di1 is mounted on the first area 121 such that the cathode CP (see FIG. 6) and the first area 121 face each other, and are electrically coupled to each other. The lower electrode DP and the cathode CP may be fixedly mounted to the first area 121 through solder or sintered material, for example.

The arrangement of the first transistors Tr1 and the first diodes Di1 on the first area 121 is not particularly limited. For example, the plurality of first transistors Tr1 may be aligned in the X direction as illustrated in FIG. 2, and the first diodes Di1 may be disposed alongside the respective first transistors Tr1 on the side toward the second area 122.

The second area 122 is the area to which a P terminal (i.e., first input terminal) 21 for supplying positive power to the semiconductor module 1 is coupled. One end of the P terminal 21 may be fixedly mounted to the second area 122 through solder or sintered material, for example. The other end of the P terminal 21, which is situated outside the case 2 (see FIG. 1), is coupled to an external apparatus (or external circuit). Accordingly, the second area 122 is coupled to the external apparatus (or external circuit) through the P terminal 21, thereby serving as an outside connecting area.

It suffices for the second area 122 to have an area of sufficient size for the P terminal to be connected. The second area 122 is seamlessly connected to the first area 121. The second area 122 may be formed near an edge of the substrate 11. FIG. 2 illustrates an example in which the second area 122 is formed near an edge 11b of the substrate 11.

The N pad 13 is disposed on the surface 11a of the substrate 11 (namely, on the second insulating layer 111b). The N pad 13 is coupled to an N terminal (second input terminal) 22 for supplying negative power (second power) such as negative voltage to the power conversion circuit 3. Accordingly, the N pad 13 is an electrode pattern (or interconnection pattern) for supplying negative power to the power conversion circuit 3. An example of the material of the N pad 13 is copper. One end of the N terminal 22 may be fixedly mounted to the N pad 13 through solder or sintered material, for example. The other end of the N terminal 22, which is situated outside the case 2, is coupled to an external apparatus (or external circuit). The N pad 13 is thus coupled to the external apparatus (or external circuit) through the N terminal 22. It suffices for the N pad 13 to have an area of sufficient size for the N terminal 22 to be connected and also for accommodating interconnections (i.e., wirings) which will be described later. The N pad 13 is disposed near an edge of the circuit substrate 10, for example. FIG. 2 illustrates an example in which the N pad 13 is formed near an edge 11b the substrate 11.

The O pad 14 is disposed on the surface 11a of the substrate 11 (namely, on the second insulating layer 111b). At least part of the O pad 14 is disposed between the P pad 12 and the N pad 13. The O pad 14 is an electrode pattern (or interconnection pattern) for outputting the output power (e.g., alternating voltage) of the power conversion circuit 3. An example of the material of the O pad 14 is copper. The O pad 14 includes a first area 141 and a second area 142. In FIG. 2, the boundary between the first area 141 and the second area 142 is shown by a dash-and-two-dot line for illustrative purposes. This also applies to other drawings (e.g., FIG. 1).

The first area 141 is the transistor mounting area on which the plurality of second transistors Tr2 are mounted. The first area 141 also has the second diodes Di2 mounted thereon each corresponding to a respective second transistor Tr2. It suffices for the first area 141 to have an area of sufficient size for mounting the plurality of second transistors Tr2 and the plurality of second diodes Di2. The first area 141 is not limited to a particular shape, and may be a quadrilateral such as a rectangle or a square.

Each second transistor Tr2 is mounted on the first area 141 such that the lower electrode DP and the first area 141 face each other, and are electrically coupled to each other. Each second diode Di2 is mounted on the first area 141 such that the cathode CP (see FIG. 5) and the first area 141 face each other, and are electrically coupled to each other. The lower electrode DP and the cathode CP may be fixedly mounted to the first area 141 through solder or sintered material, for example.

The arrangement of the second transistors Tr2 and the second diodes Di2 on the first area 141 is not particularly limited. For example, the plurality of second transistors Tr2 may be aligned in the X direction as illustrated in FIG. 2, and the second diodes Di2 may be disposed alongside the respective second transistors Tr2 on the side toward the second area 142.

The second area 142 is the area to which an O terminal (i.e., output terminal) 23 for outputting the output power of the power conversion circuit 3 is coupled. One end of the O terminal 23 may be fixedly mounted to the second area 142 through solder or sintered material, for example. The other end of the O terminal 23, which is situated outside the case 2, is coupled to an external apparatus (or external circuit). Accordingly, the second area 142 is coupled to the external apparatus (or external circuit) through the O terminal 23, thereby serving as an outside connecting area. It suffices for the second area 142 to have an area of sufficient size for the O terminal 23 to be connected and also for accommodating interconnections (i.e., wiring) which will be described later. The second area 142 may generally be formed near an edge of the circuit substrate 10. FIG. 2 illustrates an example in which the second area 142 is formed near the edge 11b of the substrate 11. In the configuration illustrated in FIG. 2, the second area 142 is situated between the N pad 13 and the second area 122 of the P pad 12, so that the second area 122, the second area 142, and the N pad 13 are aligned in the X direction.

The first control pad 15 is an electrode pattern (or interconnection pattern) to which a first control terminal 24 for supplying a control signal (i.e., gate signal or gate voltage) to the second upper electrodes GP of the first transistors Tr1 is connected to, thereby serving as a gate pad. An example of the material of the first control pad 15 is copper. One end of the first control terminal 24 may be fixedly mounted to the first control pad 15 through solder or sintered material, for example. The other end of the first control terminal 24, which is situated outside the case 2, is coupled to an external apparatus (or external circuit). Accordingly, the first control pad 15 is electrically coupled to the external apparatus (or external circuit) through the first control terminal 24. It suffices for the first control pad 15 to have an area of sufficient size for the first control terminal 24 to be connected and also for interconnections (i.e., wirings) to be provided, which will be described later. It suffices for the first control pad 15 to be disposed on the substrate such that interconnections to the second upper electrodes GP of the first transistors Tr1 are easily made. FIG. 2 illustrates an example in which the second control pad 15 is disposed near an edge 11c of the substrate 11 opposite the edge 11b.

The second control pad 16 is an electrode pattern (or interconnection pattern) to which a second control terminal 25 for supplying a control signal (i.e., gate signal or gate voltage) to the second upper electrodes GP of the second transistors Tr2 is connected to, thereby serving as a gate pad. An example of the material of the second control pad 16 is copper. One end of the second control terminal 25 may be fixedly mounted to the second control pad 16 through solder or sintered material, for example. The other end of the second control terminal 25, which is situated outside the case 2, is coupled to an external apparatus (or external circuit). Accordingly, the second control pad 16 is electrically coupled to the external apparatus (or external circuit) through the second control terminal 25. It suffices for the second control pad 16 to have an area of sufficient size for the second control terminal 25 to be connected and also for interconnections (i.e., wirings) to be provided, which will be described later. It suffices for the second control pad 16 to be disposed on the substrate 11 such that interconnections to the second upper electrodes GP of the second transistors Tr2 are easily made. FIG. 2 illustrates an example in which the second control pad 16 is disposed near the edge 11c of the substrate 11.

The first auxiliary pad 17 is an electrode pattern (or interconnection pattern) to which a first auxiliary terminal 26 for outputting the potential of the first upper electrodes SP of the first transistors Tr1 is connected. An example of the material of the first auxiliary pad 17 is copper. One end of the first auxiliary terminal 26 may be fixedly mounted to the first auxiliary pad 17 through solder or sintered material, for example. The other end of the first auxiliary terminal 26, which is situated outside the case 2, is coupled to an external apparatus (or external circuit). Accordingly, the first auxiliary pad 17 is electrically coupled to the external apparatus (or external circuit) through the first auxiliary terminal 26. In the case of the first upper electrode SP being a source electrode, the first auxiliary pad 17 serves as an upper-arm-side source pad of the semiconductor module 1. The potential of the first upper electrodes SP output from the first auxiliary terminal 26 may be utilized to generate a control signal that is supplied to the second upper electrodes GP of the first transistors Tr1, for example. It suffices for the first auxiliary pad 17 to be disposed on the substrate 11 such that interconnections to the first upper electrodes SP of the first transistors Tr1 are easily made. FIG. 2 illustrates an example in which the first auxiliary pad 17 is disposed near the edge 11c of the substrate 11. It suffices for the first auxiliary pad 17 to have an area of sufficient size for the first auxiliary terminal 26 to be connected and also for interconnections (i.e., wirings) to be provided, which will be described later.

The second auxiliary pad 18 is an electrode pattern (or interconnection pattern) to which a second auxiliary terminal 27 for outputting the potential of the first upper electrodes SP of the second transistors Tr2 is connected. An example of the material of the second auxiliary pad 18 is copper. One end of the second auxiliary terminal 27 may be fixedly mounted to the second auxiliary pad 18 through solder or sintered material, for example. The other end of the second auxiliary terminal 27, which is situated outside the case 2, is coupled to an external apparatus (or external circuit). Accordingly, the second auxiliary pad 18 is electrically coupled to the external apparatus (or external circuit) through the second auxiliary terminal 27. In the case of the upper electrode SP being a source electrode, the second auxiliary pad 18 serves as a lower-arm-side source pad of the semiconductor module 1. The potential of the first upper electrodes SP output from the second auxiliary terminal 27 may be utilized to generate a control signal that is supplied to the second upper electrodes GP of the second transistors Tr2, for example. It suffices for the second auxiliary pad 18 to be disposed on the circuit substrate 10 such that interconnections to the first upper electrodes SP (i.e., source electrodes) of the second transistors Tr2 are easily made. FIG. 2 illustrates an example in which the second auxiliary pad 18 is disposed near the edge 11c of the substrate 11. It suffices for the second auxiliary pad 18 to have an area of sufficient size for the second auxiliary terminal 27 to be connected and also for interconnections (i.e., wirings) to be provided, which will be described later.

The P terminal 21, the N terminal 22, the O terminal 23, the first control terminal 24, the second control terminal 25, the first auxiliary terminal 26, and the second auxiliary terminal 27 may be the constituent elements of the semiconductor module 1 when the semiconductor module 1 is implemented as a configuration having the case 2.

The conductive layer 112 includes a first area 112a, a second area 112b, and an middle area 112c, as illustrated in FIG. 2 and FIG. 3. An example of the material of the conductive layer 112 is copper.

The first area 112a is that area of the conductive layer 112 which faces the P pad 12 as illustrated in FIG. 2 and FIG. 4. As illustrated in FIG. 2 and FIG. 3, the shape of the first area 112a as viewed in the thickness direction of the substrate 11 may be substantially the same as that of the P pad 12.

The second area 112b is that area of the conductive layer 112 which faces the N pad 13 as illustrated in FIG. 2 and FIG. 5. As illustrated in FIG. 2 and FIG. 3, the shape of the second area 112b as viewed in the thickness direction of the substrate 11 may be substantially the same as that of the N pad 13.

The middle area 112c, which is an area connecting the first area 112a and the second area 112b as illustrated in FIG. 2 and FIG. 3, is seamlessly connected to the first area 112a and to the second area 112b. With this arrangement, the first area 112a and the second area 112b are electrically coupled. In FIG. 3, the boundary between the first area 112a and the middle area 112c and the boundary between the second area 112b and the middle area 112c are shown by dash-and-two-dot lines for illustrative purposes. In one embodiment, the middle area 112c may be disposed such as to avoid overlapping the O pad 14 as viewed in the thickness direction of the substrate 11 as illustrated in FIG. 2 and FIG. 6.

The second area 112b of the conductive layer 112 is electrically coupled to the N pad 13 as illustrated in FIG. 5. Specifically, the second area 112b and the N pad 13 are electrically coupled through at least one via (conductive part) B that is formed in the second insulating layer 111b to penetrate through the second insulating layer 111b. The conductive layer 112 is electrically insulated by the second insulating layer 111b from any pads, other than the N pad 13, among the pads disposed on the second insulating layer 111b. Accordingly, the first area 112a is insulated from both the P pad 12 and the O pad 14 by the second insulating layer 111b. The middle area 112c is also insulated from both the P pad 12 and the O pad 14 by the second insulating layer 111b. The potential of the conductive layer 112 is thus the same as the potential of the N pad 13.

Figure 7:
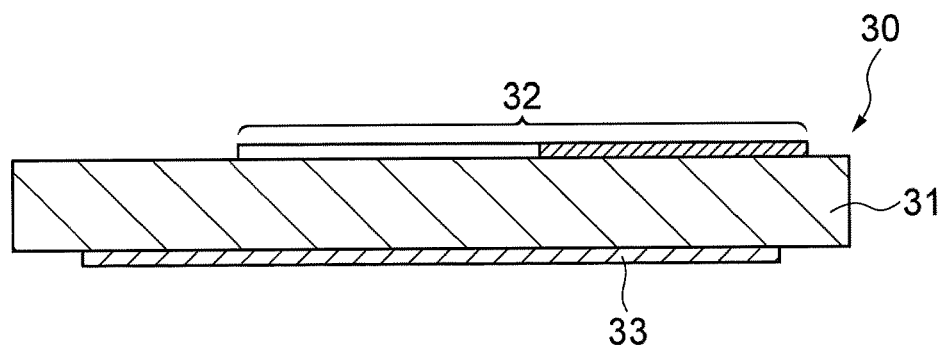
FIG. 7 is a diagram for the purpose of illustrating the steps of making the circuit substrate.
Figure 8:
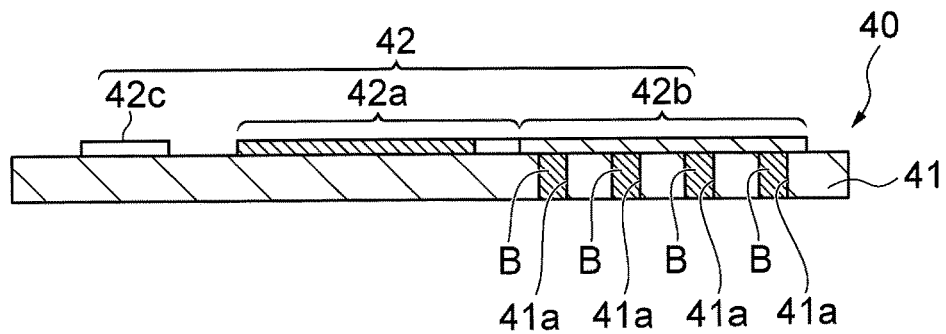
FIG. 8 is a diagram for the purpose of illustrating the steps of making the circuit substrate.

An example of a method of making the circuit substrate 10 will be described by using FIG. 7 and FIG. 8. FIG. 7 and FIG. 8 correspond to a cross-section taken along the line V-V in FIG. 2.

As illustrated in FIG. 7, an insulating raw sheet 30 having a conductive film is made. The insulating raw sheet 30 having a conductive film is produced by forming an insulating raw sheet (ceramics raw sheet) 31 made of an insulating material (e.g., ceramics) that is to become the first insulating layer 111a, subsequently forming on a surface of the insulating raw sheet 31 a conductive film 32 that is to become the conductive layer 112, and also forming on the back surface a conductive film 33 that is to become the heat dissipation layer RL. The conductive film 32 and the conductive film 33 are formed by printing conductive paste, containing materials to become the conductive layer 112 and the heat dissipation layer RL, on the front surface and the back surface to form patterns corresponding to the conductive layer 112 and the heat dissipation layer RL, respectively.

Along with the making of the insulating raw sheet 30 having a conductive film, an insulating raw sheet 40 having a conductive film is made as illustrated in FIG. 8. Specifically, an insulating raw sheet 41 is formed by using an insulating material (e.g., ceramics) that is to become the second insulating layer 111b. Penetrating holes 41a for the vias B are formed through the insulating raw sheet 41. Subsequently, a conductive film 42 that is to become the P pad 12, the N pad 13, the O pad 14, the first control pad 15, the second control pad 16, the first auxiliary pad 17, and the second auxiliary pad 18 is formed on a surface of the insulating raw sheet 41. Since FIG. 8 corresponds to the cross-section taken along the line V-V in FIG. 2, FIG. 8 shows a pad film part 42a to become the O pad 14, a pad film part 42b to become the N pad 13, and a pad film part 42c to become the second control pad 16. Similarly to the case of the conductive layer 112, the conductive film 42 may be formed by printing conductive paste, containing the material to become these pads, on the insulating raw sheet 41 such as to form the respective pad patterns. When this is done, the penetrating holes 41a are also filled with the conductive paste. The results in the insulating raw sheet 40 having a conductive film.

Subsequently, the insulating raw sheet 40 having a conductive film is laminated onto the insulating raw sheet 30 having a conductive film, such that a surface (i.e., the surface having the conductive film 32) of the insulating raw sheet 30 having a conductive film faces the back surface of the insulating raw sheet 40 having a conductive film. The multilayered structure comprised of the insulating raw sheet 30 having a conductive film and the insulating raw sheet 40 having a conductive film is calcined all together, which results in the circuit substrate 10.

Figure 9:
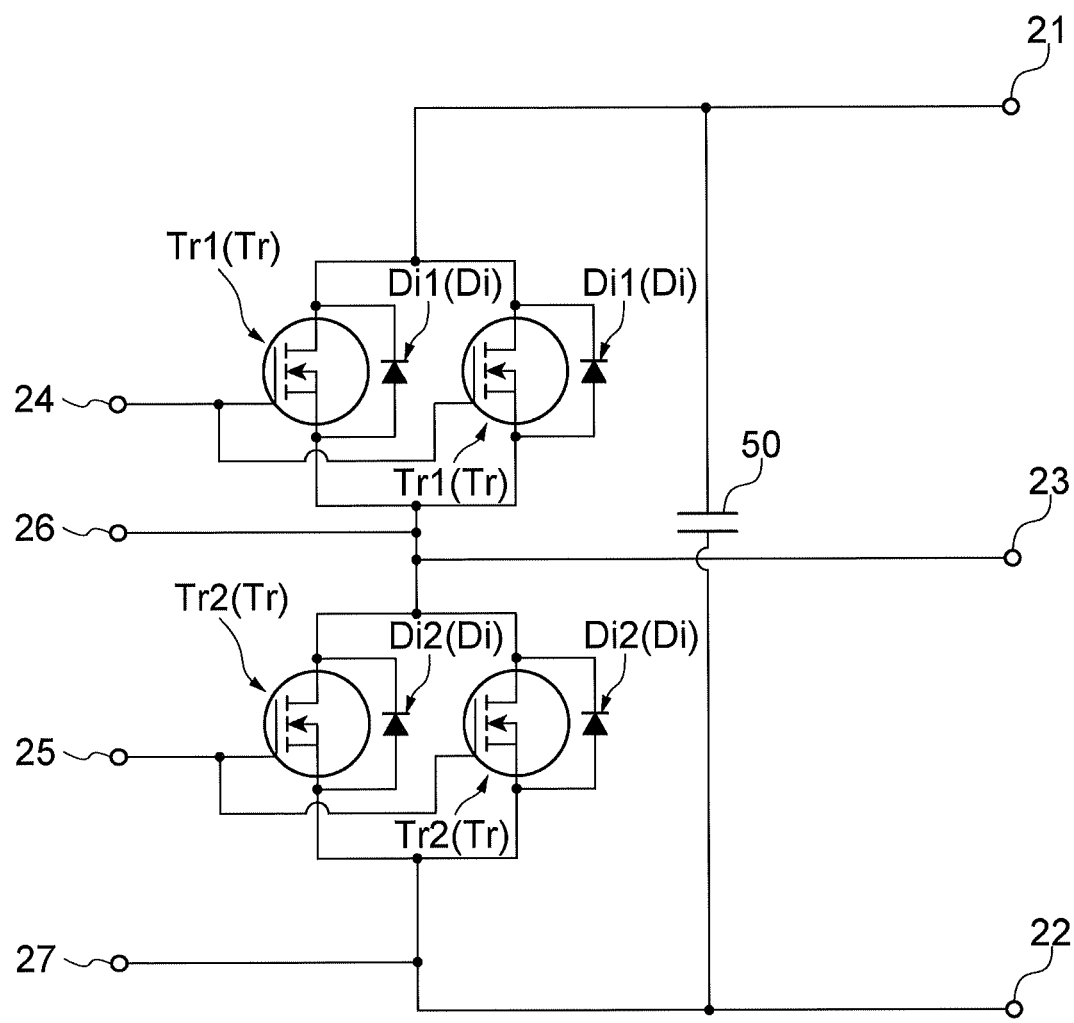
FIG. 9 is a drawing illustrating an equivalent circuit of the semiconductor module illustrated in FIG. 1.

In the following, electrical connections including interconnection structures in the semiconductor module 1 will be described by referring to FIG. 1 and FIG. 9. FIG. 9 is a drawing illustrating an equivalent circuit of the semiconductor module 1. In FIG. 9, those elements corresponding to the constituent elements of the semiconductor module 1 are referred to by the same or similar reference characters. The semiconductor module 1 has interconnections placed therein such as to implement the equivalent circuit illustrated in FIG. 9.

The lower electrodes DP of the first transistors Tr1 and the cathodes CP of the first diodes Di1 are electrically coupled through the P pad 12, and the P pad 12 is connected to the P terminal 21. Accordingly, the lower electrodes DP of the first transistors Tr1 and the cathodes CP of the first diodes Di1 are electrically coupled to the P terminal 21. Further, the first upper electrodes SP of the first transistors Tr1 are coupled through wires W1 to the respective anodes AP of the first diodes Di1. In this manner, the first transistors Tr1 and the first diodes Di1 are coupled in reverse parallel, with the first diodes Di1 serving as freewheeling diodes. Wires, ribbons, or the like are used as the wires W1, for example. The material of the wires W1 is copper, aluminum, or the like, for example. The number of wires W1 may be one, or may be more than one.

The second upper electrode GP of the first transistors Tr1 are coupled to the first control pad 15 through wires W2. Wires, ribbons, or the like are used as the wires W2, for example. The material of the wires W2 is copper, aluminum, or the like, for example. Due to the fact that the first control terminal 24 is coupled to the first control pad 15, the second upper electrodes GP of the first transistors Tr1 are electrically coupled to the first control terminal 24. A control signal can thus be applied through the first control terminal 24 to the second upper electrodes GP of the first transistors Tr1.

The first upper electrodes SP of the first transistors Tr1 are coupled to the first auxiliary pad 17 through wires W3. Wire, ribbons, or the like are used as the wires W3, for example. The material of the wires W3 is copper, aluminum, or the like, for example. Due to the fact that the first auxiliary terminal 26 is coupled to the first auxiliary pad 17, the first upper electrodes SP of the first transistors Tr1 are electrically coupled to the first auxiliary terminal 26. Accordingly, the potential of the first upper electrodes SP of the first transistors Tr1 can be output through the first auxiliary terminal 26, and the output potential can be utilized to generate a control signal for controlling the first transistors Tr1.

The anodes AP of the first diodes Di1 are coupled to the O pad 14 through wires W4. Accordingly, the first upper electrodes SP of the first transistors Tr1 are electrically coupled to the O pad 14 through the anodes AP of the first diodes Di1 and the wires W4. The plurality of first transistors Tr1 are thus electrically coupled in parallel. In the configuration illustrated in FIG. 1, the wires W4 are coupled at one end thereof to the second area 142 of the O pad 14, for example. Wires, ribbons, or the like are used as the wires W4, for example. The material of the wires W4 is copper, aluminum, or the like, for example. The number of wires W4 may be one, or may be more than one.

The lower electrodes DP of the second transistors Tr2 and the cathodes CP of the second diodes Di2 are electrically coupled through the O pad 14, and the O pad 14 is connected to the O terminal 23. Accordingly, the lower electrodes DP of the second transistors Tr2 and the cathodes CP of the second diodes Di2 are electrically coupled to the O terminal 23. Further, the first upper electrodes SP of the second transistors Tr2 are coupled through wires W5 to the respective anodes AP of the second diodes Di2. In this manner, the second transistors Tr2 and the second diodes Di2 are coupled in reverse parallel, with the second diodes Di2 serving as freewheeling diodes. Wires, ribbons, or the like are used as the wires W5, for example. The material of the wires W5 is copper, aluminum, or the like, for example. The number of wires W5 may be one, or may be more than one.

The second upper electrode GP of the second transistors Tr2 are coupled to the second control pad 16 through wires W6. Wires, ribbons, or the like are used as the wires W6, for example. The material of the wires W6 is copper, aluminum, or the like, for example. Due to the fact that the second control terminal 25 is coupled to the second control pad 16, the second upper electrodes GP of the second transistors Tr2 are electrically coupled to the second control terminal 25. A control signal can thus be applied through the second control terminal 25 to the second upper electrodes GP of the second transistors Tr2.

The first upper electrodes SP of the second transistors Tr2 are coupled to the second auxiliary pad 18 through wires W7. Wires, ribbons, or the like are used as the wires W7, for example. The material of the wires W7 is copper, aluminum, or the like, for example. Due to the fact that the second auxiliary terminal 27 is coupled to the second auxiliary pad 18, the first upper electrodes SP of the second transistors Tr2 are electrically coupled to the second auxiliary terminal 27. Accordingly, the potential of the first upper electrodes SP of the second transistors Tr2 can be output through the second auxiliary terminal 27, and the output potential can be utilized to generate a control signal for controlling the second transistors Tr2.

The anodes AP of the second diodes Di2 are coupled to the N pad 13 through wires W8. Wires, ribbons, or the like are used as the wires W8, for example. The material of the wires W8 is copper, aluminum, or the like, for example. The number of wires W8 may be one, or may be more than one. Accordingly, the first upper electrodes SP of the second transistors Tr2 are coupled to the N pad 13 through the anodes AP of the second diodes Di2 and the wires W8. The plurality of second transistors Tr2 are thus electrically coupled in parallel.

In the interconnection structure described above, the first upper electrodes SP of the first transistors coupled in parallel are electrically coupled to the O pad 14, and the lower electrodes DP of the second transistors Tr2 coupled in parallel are electrically coupled to the O pad 14. Accordingly, the first upper electrodes SP of the first transistors Tr1 coupled in parallel are electrically coupled to the lower electrodes DP of the second transistors Tr2 coupled in parallel. Further, the lower electrodes DP of the first transistors Tr1 coupled in parallel are electrically coupled to the P terminal 21, and the first upper electrodes SP of the second transistors Tr2 coupled in parallel are electrically coupled to the N terminal 22. Accordingly, as illustrated in FIG. 9, the group of first transistors Tr1 coupled in parallel and the group of second transistors Tr2 coupled in parallel are connected in series between the P terminal 21 and the N terminal 22. In this manner, the configuration on the circuit substrate 10 constitutes the power conversion circuit 3.

The substrate 11 of the circuit substrate has the conductive layer 112. The second area 112b of the conductive layer 112 is electrically coupled to the N pad 13 through the vias B. The first area 112a of the conductive layer 112 is connected to the second area 112b through the middle area 112c, so that the potential of the conductive layer 112 is the same as the potential of the N pad 13. The P pad 12 and the first area 112a facing the P pad 12 are insulated from each other by the second insulating layer 111b. Accordingly, the P pad 12, the first area 112a, and the second insulating layer 111b disposed therebetween constitute a capacitor 50 (see FIG. 9). For example, an area of a 35-mm square (i.e., a square of side 35 mm) provides a capacitance of approximately 1 nF in the case of the distance between the P pad 12 and the first area 112a being 0.1 mm.

This capacitor 50 is coupled in parallel between the P terminal 21 and the N terminal 22 with respect to the series circuit comprised of the group of parallel-connected first transistors Tr1 and the group of parallel-connected second transistors Tr2 as illustrated in FIG. 9, thereby serving as a surge voltage absorbing capacitor for absorbing surge voltage. The configuration of the semiconductor module 1 is thus capable of reducing surge voltage. The capacitance of the capacitor 50, which may be a value responsive to the size of a surge voltage needing to be reduced, can be adjusted in response to the size of the P pad 12 and the first area 112a and the distance between the P pad 12 and the first area 112a.

In the configuration of the semiconductor module 1, control signals are applied to the first transistors Tr1 and the second transistors Tr2 through the first control terminal 24 and the second control terminal 25, respectively, to turn on/off the first transistors Tr1 and the second transistors Tr2 alternately. The direct-current power (e.g., direct-current voltage) applied between the P terminal 21 and the N terminal 22 can thus be converted into alternating-current power (e.g., alternating-current voltage) output from the O terminal 23.

In the power conversion circuit 3 including the first transistors Tr1 and the second transistors Tr2 connected in series between the P terminal 21 and the N terminal 22, surge voltage occurs when each of the first transistors Tr1 and the second transistors Tr2 is turned on or off.

The size of surge voltage is calculated by $L \times di/dt$ when the current is denoted as i, and the inductance is denoted as L. The inductance that controls the size of surge voltage includes the wire inductance of the path through which the current i flows. Further, di/dt depends on the speed of switching of the first transistors Tr1 and the second transistors Tr2. As continuing efforts have been made to increase the speed of switching, there is a tendency for di/dt to increase. Especially when a wide-bandgap semiconductor is used as the material for the first transistors Tr1 and the second transistors Tr2, di/dt tends to increase because the switching speed is faster than in the case of Si. It is thus important, for the purpose of effectively reducing surge voltage, to reduce the wire inductance included in the inductance L.

In the semiconductor module 1, the capacitor 50 for absorbing surge voltage is constituted by the P pad 12, the first area 112a, and the second insulating layer 111b placed therebetween, so that the capacitor 50 for absorbing surge voltage is situated in proximity to at least the first transistors Tr1. This arrangement serves to reduce the wire inductance, thereby more reliably reducing surge voltage.

The potential of the O pad 14 constantly changes due to the switching. If the conductive layer 112 (e.g., the middle area 112c) was in existence directly below the O pad 14, a parasitic capacitance would be formed between the O pad 14 and the conductive layer 112. With this parasitic capacitance being denoted as C, a displacement current defined as $C \times (dv/dt)$ would flow from the O pad 14 to the N pad 13 through the conductive layer 112, thereby being likely to create an irregular potential distribution in the N pad 13.

In contrast, the configuration in which the conductive layer 112 (e.g., the middle area 112c) does not overlap the O pad 14 serves to prevent a potential displacement in the N pad 13 and the conductive layer 112.

In the semiconductor module 1, the group of first transistors Tr1 coupled in parallel and the group of second transistors Tr2 coupled in parallel are connected in series. This arrangement enables a large current to flow in the semiconductor module 1.

Due to the fact that the semiconductor module 1 has the plurality of first transistors Tr1, the area of the first area 121 having the plurality of first transistors Tr1 mounted thereon are larger than an area of a sufficient size for mounting a single first transistor Tr1, for example.

In the semiconductor module 1, the capacitor 50 for absorbing surge voltage is constituted by the first area 121 of the P pad 12 having the first transistors Tr1 mounted thereon, the first area 112a of the conductive layer 112, and the second insulating layer 111b, so that the capacitor 50 is situated in proximity to the plurality of first transistors Tr1. Accordingly, reduction in the wire inductance is enabled despite the large area of the first area 121, which serves to effectively reduce surge voltage.

[Variation]

Figure 10:
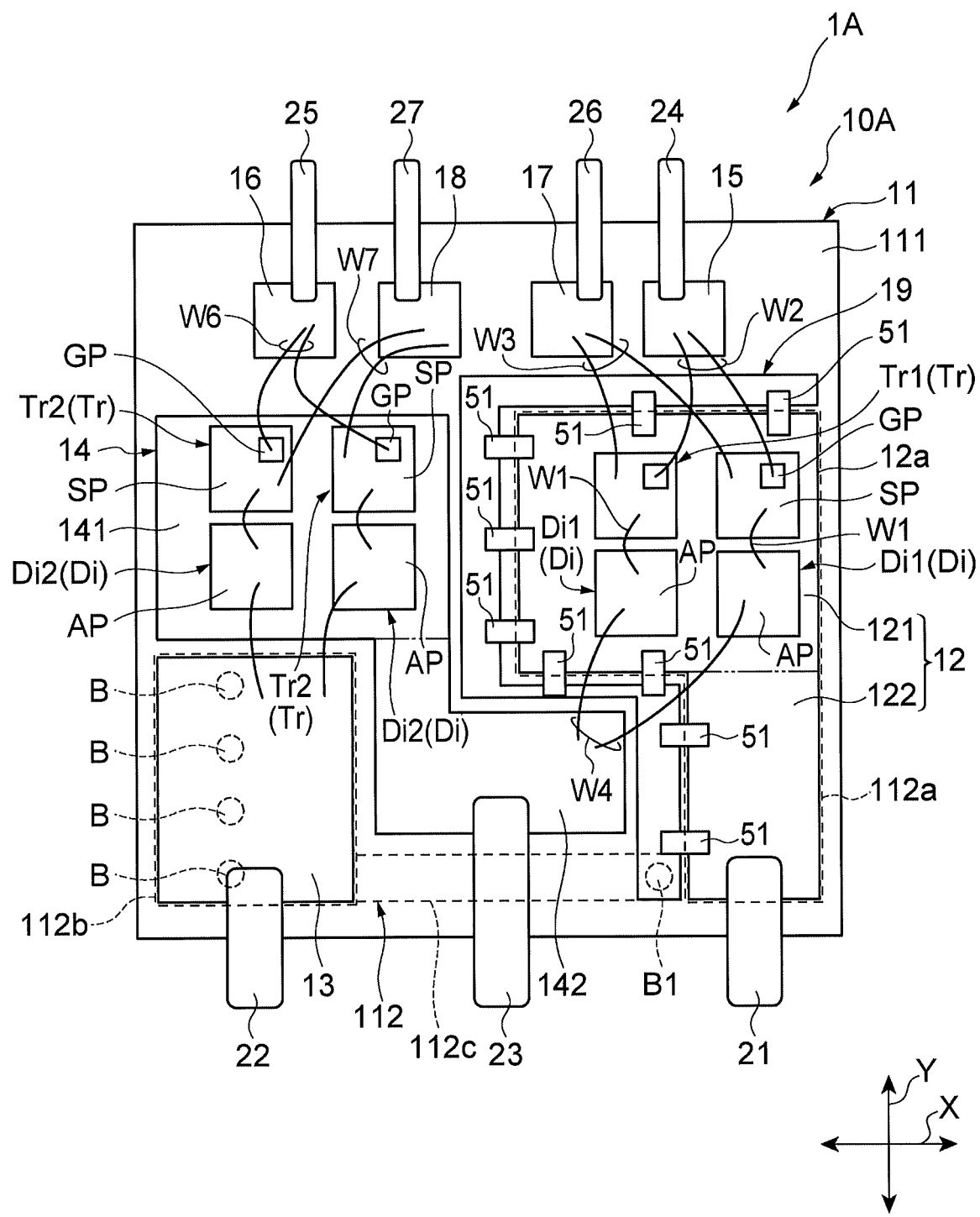
FIG. 10 is a schematic diagram illustrating a variation of the semiconductor module.

FIG. 10 is a schematic drawing illustrating an example of a semiconductor module 1A that is a variation of the semiconductor module 1. Although illustration of the case 2 is omitted in FIG. 10, the semiconductor module 1A may be provided with the case 2.

The semiconductor module 1A mainly differs from the configuration of the semiconductor module 1 in that a circuit substrate 10A is provided in place of the circuit substrate 10. The placement and interconnection structures of the first transistors Tr1, the second transistors Tr2, the P terminal 21, the N terminal 22, the O terminal 23, the first control terminal 24, the second control terminal 25, the first auxiliary terminal 26, and the second auxiliary terminal 27 on the circuit substrate 10A may be similar to the case of the semiconductor module 1.

Figure 11:
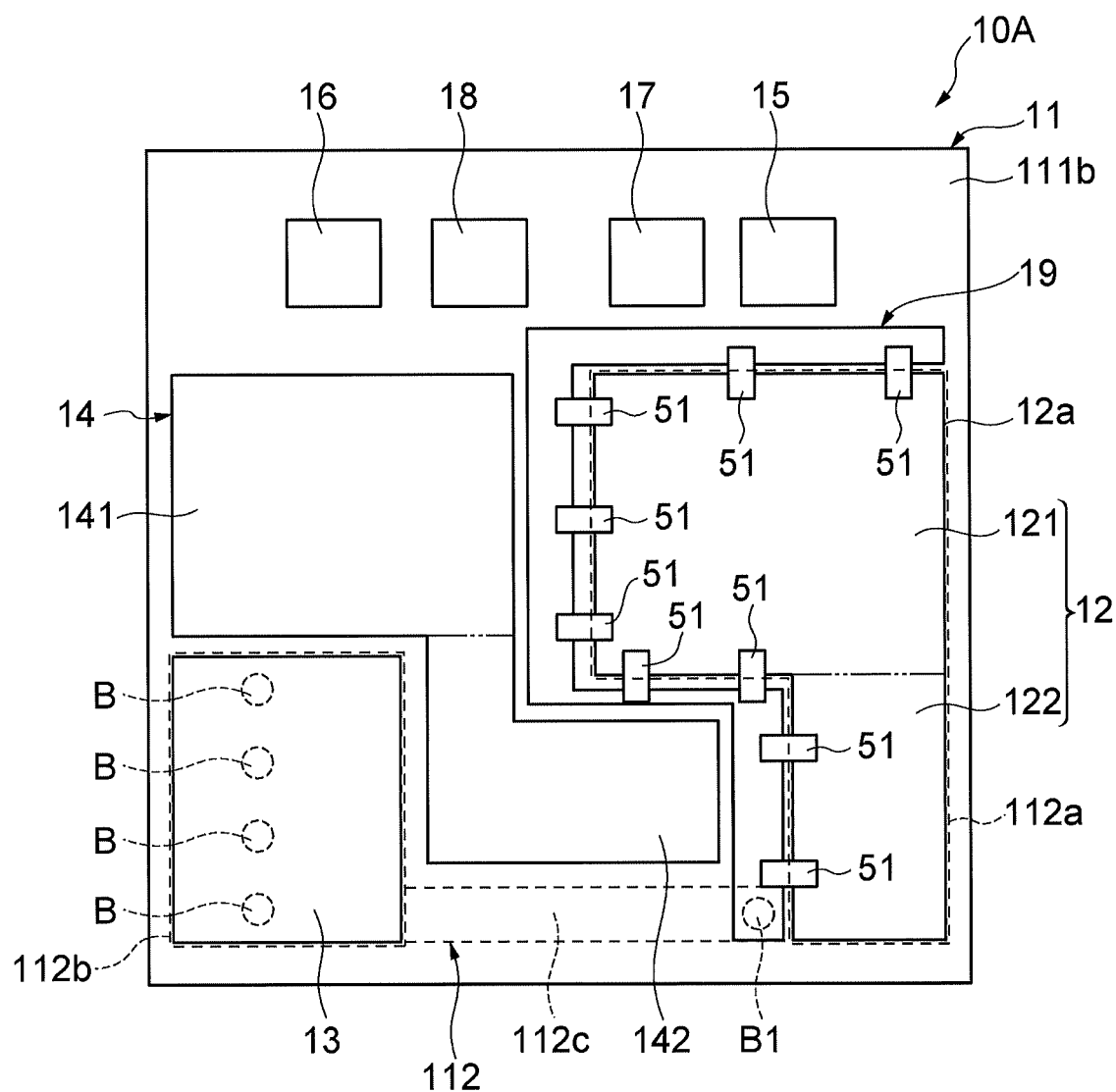
FIG. 11 is a schematic diagram of the configuration of a circuit substrate of the semiconductor module illustrated in FIG. 10.
Figure 11:
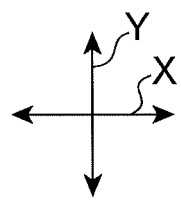

FIG. 11 is a schematic diagram of the circuit substrate 10A. The circuit substrate 10A mainly differs from the configuration of the circuit substrate 10 in that a third auxiliary pad (i.e., auxiliary interconnection pattern) 19 is provided and in that the third auxiliary pad 19 and the P pad are connected through capacitors (i.e., surge voltage absorbing elements) 51. The circuit substrate 10A will be described, with a focus on this difference.

The third auxiliary pad 19, which is situated alongside the P pad 12, is disposed on the substrate 11 (specifically on the second insulating layer 111b) such as to be isolated from the P pad 12 and the O pad 14. The third auxiliary pad 19 is coupled to the conductive layer 112 through a via (conductive part) B1 to be electrically coupled to the N pad 13. The potential of the third auxiliary pad 19 is thus the same as the potential of the N pad 13.

In one embodiment, the third auxiliary pad 19 may be disposed alongside the edges of the P pad 12 other than an edge 12a as illustrated in FIG. 11. Part of the third auxiliary pad 19 is disposed between the P pad 12 and the O pad 14, and is formed such as to overlap the middle area 112c of the conductive layer 112 as viewed in the thickness direction of the substrate 11. The via B1 provides a coupling between the middle area 112c and the third auxiliary pad 19 in an area where the middle area 112c and the third auxiliary pad 19 overlap as viewed in the thickness direction of the substrate 11, thereby electrically coupling the middle area 112c with the third auxiliary pad 19.

The third auxiliary pad 19 and the P pad 12 are coupled through at least one capacitor 51. An example of the capacitor 51 is a ceramic condenser. The potential of the third auxiliary pad 19 is the same as the potential of the N pad 13, so that the above-noted configuration is equivalent to the circuit in which the capacitor 51 is connected in parallel to the capacitor 50 between the P terminal coupled to the P pad 12 and the N terminal 22 coupled to the N pad 13. The capacitor 51 thus also serves as a surge voltage absorbing element.

In the circuit substrate 10A, the first area 121 of the P pad 12 having the first transistors Tr1 mounted thereon, the first area 112a of the conductive layer 112, and the second insulating layer 111b placed therebetween constitute the capacitor 50 for absorbing surge voltage as in the case of the circuit substrate 10. Accordingly, the semiconductor module 1A provides at least the same or similar effects and advantages as the semiconductor module 1.

In the semiconductor module 1A, which has the circuit substrate 10A, the third auxiliary pad and the P pad 12 are coupled through the capacitor 51. This capacitor 51 also serves as a surge voltage absorbing element as was previously described. In this case, the capacitance of the capacitor 50 is reinforced by the capacitor 51, which results in surge voltage being more reliably absorbed.

This variation is directed to an example in which a capacitor is used as a surge voltage absorbing element providing coupling between the third auxiliary pad 19 and the P pad 12. However, it suffices for the surge voltage absorbing element to be an element serving to absorb surge voltage. For example, an element that is a combination of a capacitor and another circuit element (e.g., resistor or varistor) may suffice.

Although the embodiments and variations of the disclosed technology have heretofore been described, the disclosed technology is not limited to these various disclosed embodiments, and various modifications may be made without departing from the scope of the disclosed technology.

The power conversion circuit is not limited to a single-phase power conversion circuit such as a single-phase inverter circuit, and may alternatively be a two-phase or three-phase power conversion circuit. The numbers of transistors are not limited to the numbers illustrated in the drawings. The semiconductor module may have at least one first transistor and at least one second transistor.

The arrangement of the first transistors and the second transistors and the interconnection structures between the first transistors, the second transistors, and the various pads (i.e., the P pad, the N pad, the O pad, and the like) are not limited to those shown in the examples, and are preferably optimized in such a manner as to minimize the wire inductance for the purpose of reducing surge voltage.

Although the use of vias has been described as an example of electrical coupling between the second input interconnection pattern and the conductive layer, a method of providing electrical coupling between the second input interconnection pattern and the conductive layer is not limited to the use of vias. For example, a conductive film (e.g., a metal film) may be formed on a side face of the second insulating part, so that the second input interconnection pattern and the conductive layer (i.e., the second area) may be electrically coupled through the conductive film. The same applies in the case of coupling between the third auxiliary pad and the conductive layer in the above-described variation. Although the conductive film is formed only on the side face of the second insulating part in the above-noted example, a conductive film may be formed on a side face of the substrate 11, so that the second input interconnection pattern and the conductive layer are electrically coupled through this conductive film. In the case of electrically coupling the second input interconnection pattern and the conductive layer by use of a conductive film formed on a side face of the second insulating part or the like, the first input interconnection pattern, the output interconnection pattern, the heat dissipation layer (i.e., the heat dissipation layer RL illustrated as an example in FIG. 4), and the like may be isolated from the conductive film formed on the side face.

Positive power (e.g., positive voltage) is used as an example of the first power, and negative power (e.g., negative voltage) is used as an example of the second power. It suffices for the first power and the second power to be such that the second power is lower than the first power. For example, in the case of the first power having a predetermined voltage, it suffices for the second power to have a lower voltage than the predetermined voltage.

DESCRIPTION OF REFERENCE SYMBOLS

1 . . . semiconductor module
3 . . . power conversion circuit
10, 10A . . . circuit substrate
11 . . . substrate
12 . . . P pad (first input interconnection pattern)
13 . . . N pad (second input interconnection pattern)
14 . . . O pad (output interconnection pattern)
19 . . . third auxiliary pad (auxiliary interconnection pattern)
21 . . . P terminal (first input terminal)
22 . . . N terminal (second input terminal)
23 . . . O terminal (output terminal)

50 . . . capacitor (surge voltage absorbing capacitor)
51 . . . capacitor
111a . . . first insulating layer (first insulating part)
111b . . . second insulating layer (second insulating part)
112 . . . conductive layer
112a . . . first area
112b . . . second area
112c . . . middle area
B . . . via
B1 . . . via
Tr . . . transistor
Tr1 . . . first transistor
Tr2 . . . second transistor

The invention claimed is:

1. A semiconductor module including a power conversion circuit, comprising:
a circuit substrate;
a first transistor mounted on the circuit substrate and constituting an upper arm of the power conversion circuit; and
a second transistor, mounted on the circuit substrate, constituting a lower arm of the power conversion circuit and electrically series-coupled to the first transistor,
wherein the circuit substrate includes:
a substrate having a first insulating part, a second insulating part disposed over the first insulating part, and a conductive layer situated between the first insulating part and the second insulating part;
a first input interconnection pattern disposed on the second insulating part and electrically coupled to a first input terminal through which a first power is supplied to the power conversion circuit, the first input interconnection pattern having the first transistor mounted thereon;
a second input interconnection pattern disposed on the second insulating part and electrically coupled to a second input terminal through which a second power lower than the first power is supplied to the power conversion circuit; and
an output interconnection pattern disposed on the second insulating part and coupled to an output terminal through which an output power of the power conversion circuit is output, the output interconnection pattern having the second transistor mounted thereon,
wherein the first transistor is electrically coupled to the first input interconnection pattern such as to receive the first power through the first input interconnection pattern,
wherein the second transistor is electrically coupled to the second input interconnection pattern such as to receive the second power through the second input interconnection pattern,
wherein the conductive layer includes:
a first area; and
a second area electrically coupled to the first area,
wherein the first area is situated opposite the first input interconnection pattern,
wherein the second area is electrically coupled to the second input interconnection pattern, and
wherein the conductive layer is insulated from the first input interconnection pattern and the output interconnection pattern by the second insulating part.

2. The semiconductor module as claimed in claim 1, wherein part of the output interconnection pattern is situated between the first input interconnection pattern and the second input interconnection pattern.

3. The semiconductor module as claimed in claim 2, wherein the conductive layer does not overlap the output interconnection pattern as viewed in a thickness direction of the substrate.

4. The semiconductor module as claimed in claim 3, wherein the circuit substrate includes an auxiliary interconnection pattern disposed in proximity to the first input interconnection pattern on the second insulating part,
wherein the conductive layer is electrically coupled to the auxiliary interconnection pattern, and
wherein the auxiliary interconnection pattern and the first input interconnection pattern are coupled through a surge voltage absorbing element.

5. The semiconductor module as claimed in claim 4, comprising:
a plurality of said first transistors; and
a plurality of said second transistors,
wherein the plurality of first transistors are mounted on the first input interconnection pattern, and are electrically coupled in parallel, and
wherein the plurality of second transistors are mounted on the output interconnection pattern, and are electrically coupled in parallel.

6. The semiconductor module as claimed in claim 3, comprising:
a plurality of said first transistors; and
a plurality of said second transistors,
wherein the plurality of first transistors are mounted on the first input interconnection pattern, and are electrically coupled in parallel, and
wherein the plurality of second transistors are mounted on the output interconnection pattern, and are electrically coupled in parallel.

7. The semiconductor module as claimed in claim 2, wherein the circuit substrate includes an auxiliary interconnection pattern disposed in proximity to the first input interconnection pattern on the second insulating part,
wherein the conductive layer is electrically coupled to the auxiliary interconnection pattern, and
wherein the auxiliary interconnection pattern and the first input interconnection pattern are coupled through a surge voltage absorbing element.

8. The semiconductor module as claimed in claim 7, comprising:
a plurality of said first transistors; and
a plurality of said second transistors,
wherein the plurality of first transistors are mounted on the first input interconnection pattern, and are electrically coupled in parallel, and
wherein the plurality of second transistors are mounted on the output interconnection pattern, and are electrically coupled in parallel.

9. The semiconductor module as claimed in claim 2, comprising:
a plurality of said first transistors; and
a plurality of said second transistors,
wherein the plurality of first transistors are mounted on the first input interconnection pattern, and are electrically coupled in parallel, and
wherein the plurality of second transistors are mounted on the output interconnection pattern, and are electrically coupled in parallel.

10. The semiconductor module as claimed in claim 1, wherein the conductive layer does not overlap the output interconnection pattern as viewed in a thickness direction of the substrate.

11. The semiconductor module as claimed in claim 10, wherein the circuit substrate includes an auxiliary interconnection pattern disposed in proximity to the first input interconnection pattern on the second insulating part,
  wherein the conductive layer is electrically coupled to the auxiliary interconnection pattern, and
  wherein the auxiliary interconnection pattern and the first input interconnection pattern are coupled through a surge voltage absorbing element.

12. The semiconductor module as claimed in claim 11, comprising:
  a plurality of said first transistors; and
  a plurality of said second transistors,
  wherein the plurality of first transistors are mounted on the first input interconnection pattern, and are electrically coupled in parallel, and
  wherein the plurality of second transistors are mounted on the output interconnection pattern, and are electrically coupled in parallel.

13. The semiconductor module as claimed in claim 10, comprising:
  a plurality of said first transistors; and
  a plurality of said second transistors,
  wherein the plurality of first transistors are mounted on the first input interconnection pattern, and are electrically coupled in parallel, and
  wherein the plurality of second transistors are mounted on the output interconnection pattern, and are electrically coupled in parallel.

14. The semiconductor module as claimed in claim 1, wherein the circuit substrate includes an auxiliary interconnection pattern disposed in proximity to the first input interconnection pattern on the second insulating part,
  wherein the conductive layer is electrically coupled to the auxiliary interconnection pattern, and
  wherein the auxiliary interconnection pattern and the first input interconnection pattern are coupled through a surge voltage absorbing element.

15. The semiconductor module as claimed in claim 14, comprising:
  a plurality of said first transistors; and
  a plurality of said second transistors,
  wherein the plurality of first transistors are mounted on the first input interconnection pattern, and are electrically coupled in parallel, and
  wherein the plurality of second transistors are mounted on the output interconnection pattern, and are electrically coupled in parallel.

16. The semiconductor module as claimed in claim 1, comprising:
  a plurality of said first transistors; and
  a plurality of said second transistors,
  wherein the plurality of first transistors are mounted on the first input interconnection pattern, and are electrically coupled in parallel, and
  wherein the plurality of second transistors are mounted on the output interconnection pattern, and are electrically coupled in parallel.

* * * * *